US010032858B2

(12) United States Patent
Bi et al.

(10) Patent No.: US 10,032,858 B2
(45) **Date of Patent: *Jul. 24, 2018**

(54) NANOSHEET CAPACITOR

(71) Applicant: INTERNATIONAL BUSINESS MACHINES CORPORATION, Armonk, NY (US)

(72) Inventors: Zhenxing Bi, Niskayuna, NY (US); Kangguo Cheng, Schenectady, NY (US); Dongbing Shao, Wappingers Falls, NY (US); Zheng Xu, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/477,351

(22) Filed: Apr. 3, 2017

(65) Prior Publication Data

US 2018/0083093 A1 Mar. 22, 2018

Related U.S. Application Data

(63) Continuation of application No. 15/271,745, filed on Sep. 21, 2016, now Pat. No. 9,685,499.

(51) Int. Cl.
*H01L 21/00* (2006.01)
*H01L 49/02* (2006.01)

(52) U.S. Cl.
CPC .................................... *H01L 28/92* (2013.01)

(58) Field of Classification Search
CPC ........................ H01L 21/7682; H01L 29/0649
See application file for complete search history.

(56) References Cited

U.S. PATENT DOCUMENTS 9,685,499 B1 * 6/2017 Bi .......................... H01L 28/60
2014/0326954 A1 * 11/2014 Han ..................... C12Q 1/6869
257/29

OTHER PUBLICATIONS

List of IBM Patents or Patent Applictions Treated As Related; (Appendix P), Filed Jan. 19, 2018, 2 pages.
Zhenxing Bi, et al., Pending U.S. Appl. No. 15/477,296 entitled "NANOSHEET CAPACITOR," filed with the U.S. Patent and Trademark Office on Apr. 3, 2017.

* cited by examiner

*Primary Examiner* — Thomas L Dickey
(74) *Attorney, Agent, or Firm* — Cantor Colburn LLP; Vazken Alexanian

(57) ABSTRACT

A capacitive device includes a first electrode comprising a nanosheet stack and a second electrode comprising a nanosheet stack, the second electrode arranged substantially parallel to the first electrode. A first conductive contact is arranged on a basal end of the first electrode, and a second conductive contact is arranged on a basal end of the second electrode.

16 Claims, 28 Drawing Sheets

NANOSHEET CAPACITOR

This application is a Continuation of Non-Provisional application Ser. No. 15/271,745, entitled "NANOSHEET CAPACITOR," filed Sep. 21, 2016 which is incorporated herein by reference in its entirety.

BACKGROUND

The present invention generally relates to semiconductor devices, and more specifically, to nanosheet capacitors.

Nanosheets often include thin layers (sheets) of semiconductor material that are arranged in a stack. A nanosheet stack often includes alternating layers of dissimilar materials. In semiconductor device fabrication, the nanosheets are often patterned into nanosheet fins. Once the fins are patterned, a gate stack is formed over a channel region of the fins, and source/drain regions are formed adjacent to the gate stack.

In some devices, once the gate stack or the source/drain regions have been formed, an etching process is performed to selectively remove nanosheet layers of one of the dissimilar materials from the fins. The etching process results in the undercutting and suspension of the layers of the nanosheet fin to form nanowires. The nanowires can be used to form gate-all-around devices.

Electronic circuits often include capacitive devices. Capacitive devices often include substantially planar electrodes that are arranged in parallel with a dielectric material disposed between the electrodes. Capacitive devices are operative to store a charge and are often included in CMOS circuit designs.

SUMMARY

According to an embodiment of the present invention, a method for forming a capacitive device includes forming a buffer layer on a substrate, and a nanosheet stack on the buffer layer. Portions of the nanosheet stack and the buffer layer are removed to form a first fin and a second fin. A first insulator layer is deposited on the substrate, and ions are implanted in the first fin and the second fin and annealing to form a first electrode and a second electrode. The first insulator layer and portions of the buffer layer in the first electrode and the second electrode are removed to form a void between the first electrode and the substrate a void between the second electrode and the substrate. A second insulator layer is deposited on the substrate and in the void under the first electrode and the void under the second electrode. A first metallic conductive contact is formed on a distal end of the first electrode and a second metallic conductive contact is formed on a distal end of the second electrode.

According to another embodiment of the present invention, a method for forming a capacitive device includes forming a buffer layer on a substrate and a nanosheet stack on the buffer layer. Portions of the nanosheet stack and the buffer layer are removed to form a first fin and a second fin. A first insulator layer is deposited on the substrate. Ions are implanted in the first fin and the second fin and annealing to form a first electrode and a second electrode. The first insulator layer and portions of the buffer layer are removed in the first electrode and the second electrode to form a void between the first electrode and the substrate a void between the second electrode and the substrate. A second insulator layer is deposited on the substrate and in the void under the first electrode and the void under the second electrode. A first crystalline conductive contact is grown on a distal end of the first electrode and a second crystalline conductive contact on a distal end of the second electrode.

According to yet another embodiment of the present invention, a capacitive device includes a first electrode comprising a nanosheet stack and a second electrode comprising a nanosheet stack, the second electrode arranged substantially parallel to the first electrode. A first conductive contact is arranged on a basal end of the first electrode, and a second conductive contact is arranged on a basal end of the second electrode.

BRIEF DESCRIPTION OF THE DRAWINGS

FIGS. 1-10C illustrate an exemplary method for forming a capacitive device.

FIG. 1 illustrates a cut-away view of a semiconductor substrate and a sacrificial buffer layer (buffer layer) arranged on the semiconductor substrate.

FIG. 2 illustrates a cut-away view following the formation of a nanosheet stack on the buffer layer.

FIG. 5 illustrates a cut-away view following an ion implantation and annealing process that implants dopants into the fins to form electrodes.

FIG. 7 illustrates a top view following the deposition of an inter-level dielectric layer over exposed portions of the substrate (of FIG. 5).

FIG. 9C illustrates a top view following the formation of the cavities.

FIG. 10C illustrates a top view of the conductive contacts and the electrodes that form a capacitive device.

FIG. 12A illustrates a cut-away view along the line A-A (of FIG. 12C) following the formation of a cavity that exposes portions of the electrode.

FIG. 12B illustrates a cut-away view along the line B-B (of FIG. 12C) following the formation of a cavity.

FIG. 12C illustrates a top view following the formation of the cavities.

DETAILED DESCRIPTION

As discussed above, nanosheets and nanosheet fins can be used to form active semiconductor devices. It is desirable to form capacitive devices using methods and materials that integrate into process flows that are used to form active devices that are formed using nanosheets.

The methods and resultant structures described herein provide for forming capacitive devices using fins formed from nanosheets. The illustrated methods can be efficiently integrated into field effect transistor (FET) fabrication process flows that form FET devices from nanosheets. The capacitive devices include two or more electrodes that are arranged on a substrate. The number of electrodes and the length of the electrodes among other parameters affects the external capacitance of the capacitive devices.

FIGS. 1-10C illustrate an exemplary method for forming a capacitive device.

Figure 1:
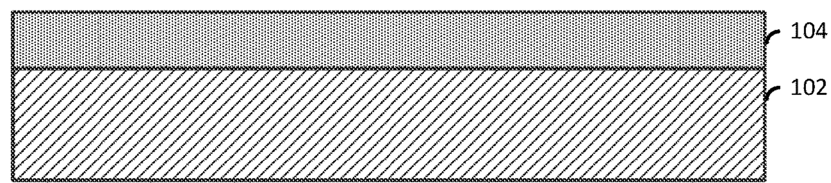

FIG. 1 illustrates a cut-away view of a semiconductor substrate 102 and a sacrificial buffer layer (buffer layer) 104 arranged on the semiconductor substrate 102.

Non-limiting examples of suitable materials for the semiconductor substrate (substrate) 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one “III element,” such as aluminum (Al), boron (B), gallium (Ga), indium (In), and at least one “V element,” such as nitrogen (N), phosphorous (P), arsenic (As), antimony (Sb).

The buffer layer 104 in the illustrated exemplary embodiment is formed by, for example, an epitaxial growth process that grows a layer of semiconductor material on the substrate 102. The buffer layer 104 in the illustrated embodiment is formed from a dissimilar material than the substrate 102. For example, if the substrate 102 includes Si, the buffer layer 104 can include Ge.

Figure 2:
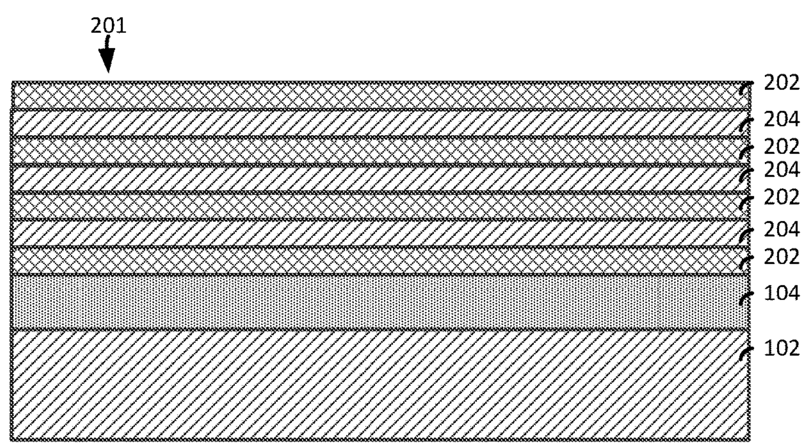

FIG. 2 illustrates a cut-away view following the formation of a nanosheet stack 201 on the buffer layer 104.

A stack of nanosheet material layers (nanosheet stack) 201 is arranged on the buffer layer 104. The nanosheet material layers in the illustrated embodiment include a first nanosheet material layer 202 and a second nanosheet material layer 204 arranged on the first nanosheet material layer 202. The stack of nanosheet material layers 201 can include any number of alternating nanosheet material layers 202 and 204. In the illustrated embodiment, the first nanosheet material layer 202 includes a silicon germanium material and the second nanosheet material layer 204 includes a silicon material. In alternate exemplary embodiments, the first nanosheet material layer 202 can be a silicon material while; the second nanosheet material layer can be silicon germanium. The stack of nanosheet material layers 201 can be formed by any suitable process. The germanium concentration (atomic concentration) in the SiGe layer ranges from about 15% to 99% and more preferably from about 25% to 60%. The Si/SiGe stack can be formed by epitaxial growth by using the semiconductor layer 102 as the seed layer.

The epitaxial growth can be performed by any suitable techniques such as ultrahigh vacuum chemical vapor deposition (UHVCVD) rapid thermal chemical vapor deposition (RTCVD), Metalorganic Chemical Vapor Deposition (MOCVD), low-pressure chemical vapor deposition (LP-CVD), limited reaction processing CVD (LRPCVD), molecular beam epitaxy (MBE). Each layer is stacked, nanosheet has a non-limiting thickness ranging from about 3-20 nm, more preferably about 5-10 nm.

Figure 3A:
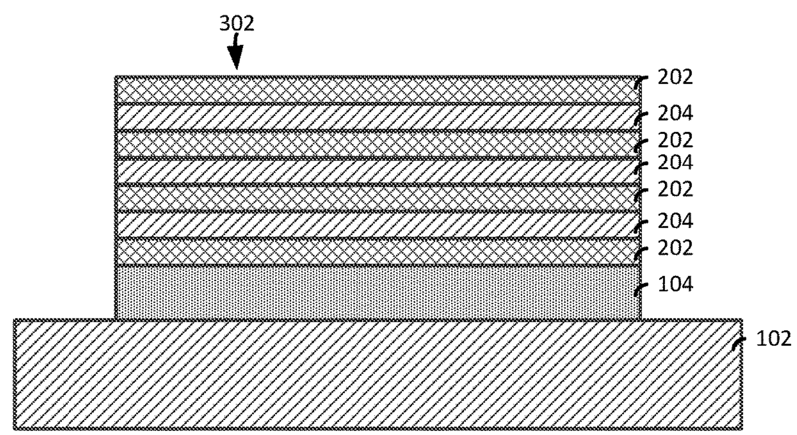
FIG. 3A illustrates a cut-away view along the line A-A (of FIG. 3B) following the patterning of electrodes from the nanosheet stack.

FIG. 3A illustrates a cut-away view along the line A-A (of FIG. 3B) following the patterning of electrodes 302 from the nanosheet stack 201. The electrodes 302 can be formed by, for example, a photolithographic patterning and etching process that removes portions of the nanosheet stack 201 and the buffer layer 104 to expose portions of the substrate 102. Any suitable etching process can be used such as, for example, reactive ion etching.

Figure 3B:
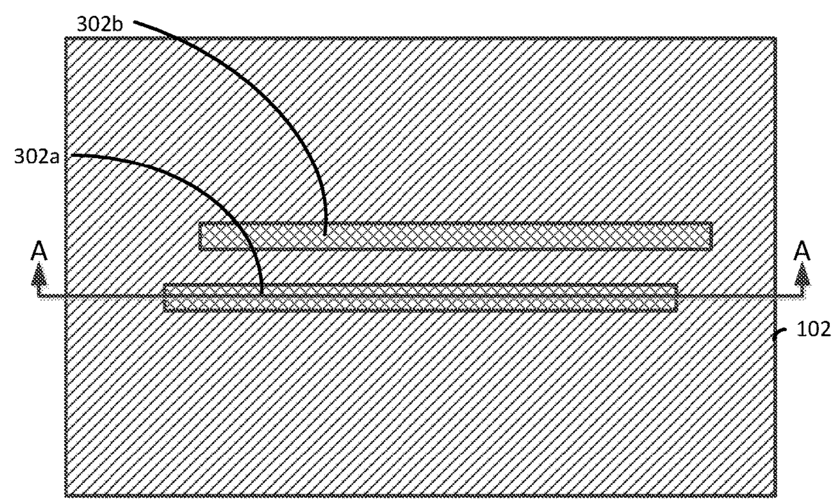
FIG. 3B illustrates a top view of the fins arranged on the substrate.

FIG. 3B illustrates a top view of the fins 302*a* and 302*b* arranged on the substrate 102.

Figure 4A:
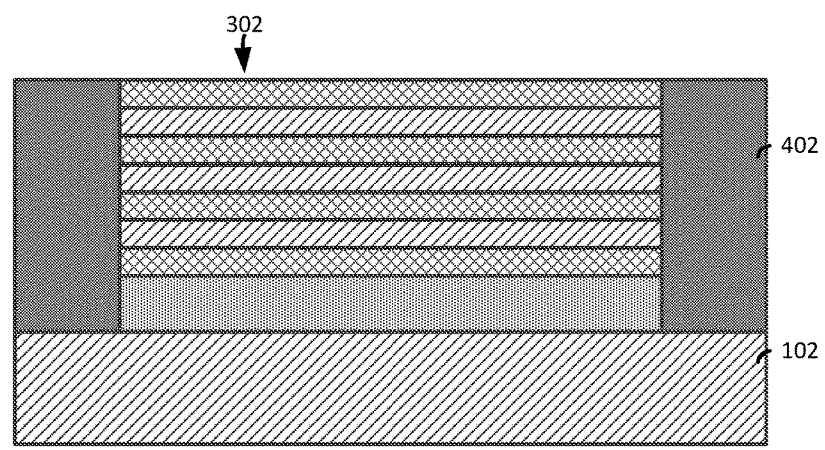
FIG. 4A illustrates a cut-away view along the line A-A (of FIG. 4B) following the formation of a shallow trench isolation (STI) region on exposed portions of the substrate.

FIG. 4A illustrates a cut-away view along the line A-A (of FIG. 4B) following the formation of an inter-level dielectric (ILD) region 402 on exposed portions of the substrate 102. The ILD region 402 can be formed by, any suitable process including, for example, lithography or etching to form trenches, and then filling the trenches with an insulating material, such as silicon dioxide.

In the illustrated embodiment, at least one isolation region can be an inter-level dielectric However, the isolation region 402 can be a trench isolation region, a field oxide isolation region (not shown), or any other type of isolation region. The isolation region 402 provides isolation between neighboring gate structure regions, and can be used when the neighboring devices have opposite conductivities, e.g., nFETs and pFETs. As such, the isolation region 402 separates an nFET device region from a pFET device region.

Figure 4B:
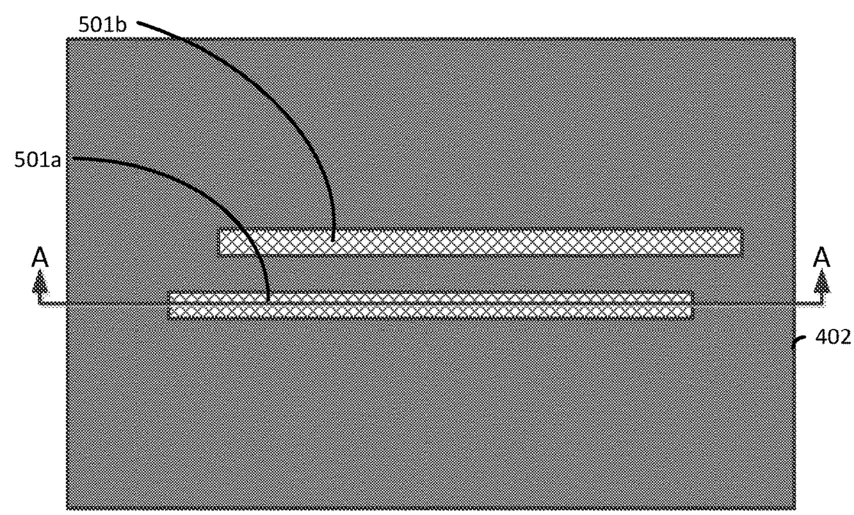
FIG. 4B illustrates a top view following the formation of the shallow trench isolation region.

FIG. 4B illustrates a top view following the formation of the inter-level dielectric region 402.

Figure 5:
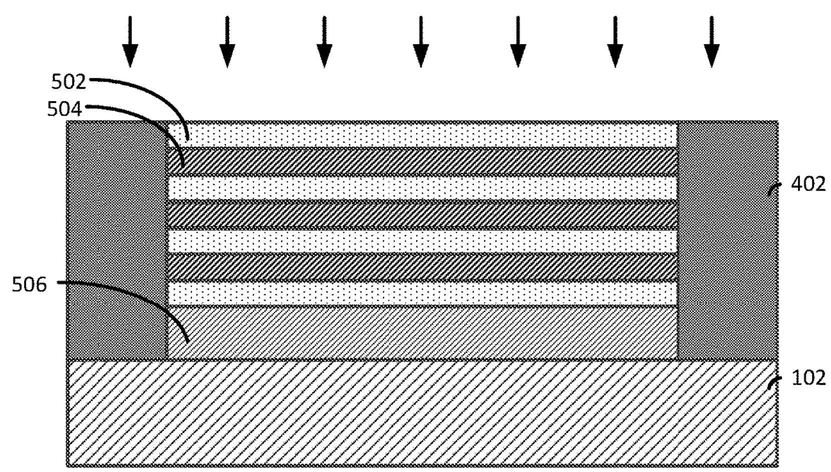

FIG. 5 illustrates a cut-away view following an ion implantation and annealing process that implants dopants into the fins 302 to form electrodes 501. The ion implantation process implants ions in the fins 302 and the annealing process drives or activates the ions through the fins 302. In some exemplary embodiments the ions can be driven into the buffer layer 104. The resulting structure includes a first doped nanosheet layer 502, a second doped nanosheet layer 504, and a doped buffer layer 506.

Figure 6A:
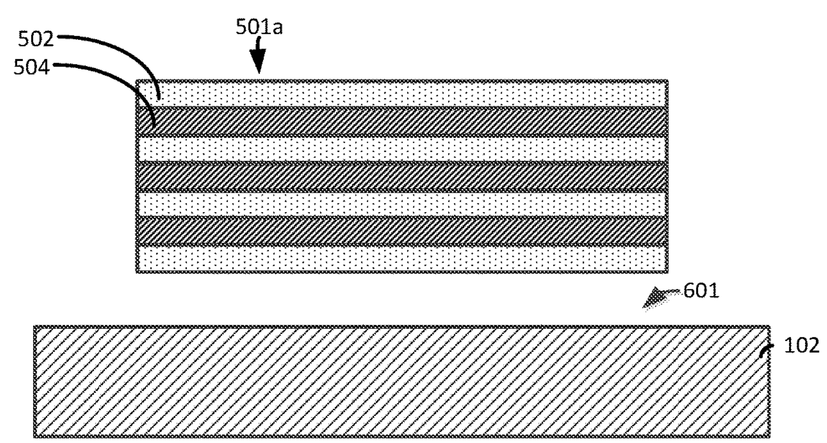
FIG. 6A illustrates a cut-away view along the line A-A (of FIG. 6D) following the removal of portions of the shallow trench isolation region (of FIG. 5) and an etching process that removes portions of the doped buffer layer from beneath the electrodes.

FIG. 6A illustrates a cut-away view along the line A-A (of FIG. 6D) following the removal of portions of the inter-level dielectric region 402 (of FIG. 5) and an etching process that removes portions of the doped buffer layer 506 from beneath the electrodes 501*a* and 501*b* to form voids 601 and 603. In this regard, the inter-level dielectric region 402 can be removed by a selective isotropic or anisotropic etching process. Any suitable selective etching process can be used such as, for example, a $H_2O_2$ or an isotropic dry etching process to remove portions of the doped buffer layer 506.

Figure 6B:
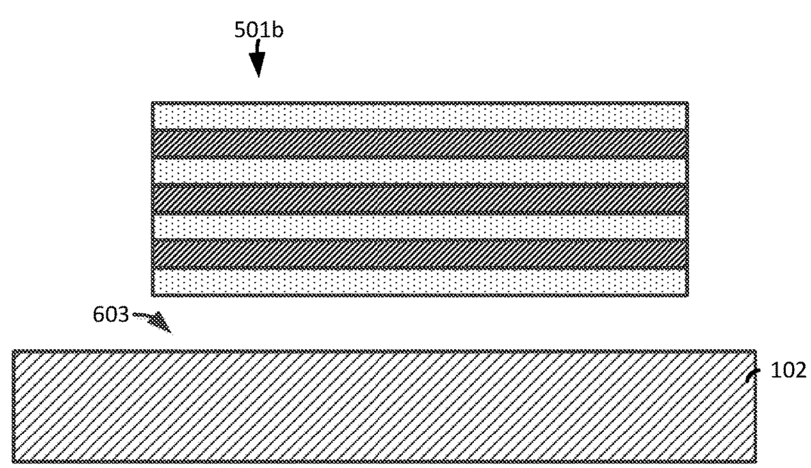
FIG. 6B illustrates a cut-away view along the line B-B (of FIG. 6D) following the selective anisotropic etching process that removes portions of the doped buffer layer.
Figure 6C:
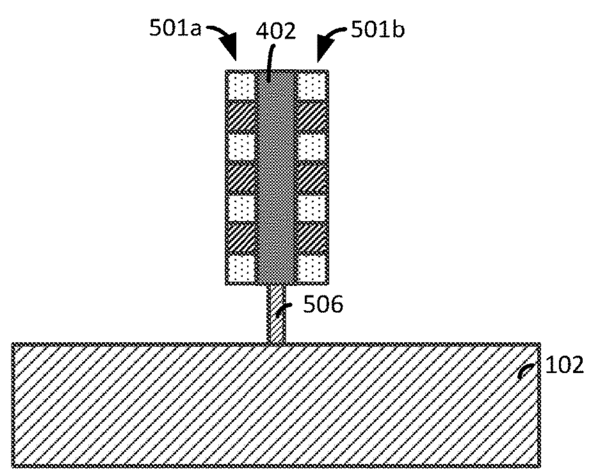
FIG. 6C illustrates a cut-away view along the line C-C (of FIG. 6D) showing the portion of the doped buffer layer that supports the inter-level dielectric layer and the electrodes.

FIG. 6B illustrates a cut-away view along the line B-B (of FIG. 6D) following the selective anisotropic etching process that removes portions of the doped buffer layer 506. FIG. 6C illustrates a cut-away view along the line C-C (of FIG. 6D) showing the portion of the doped buffer layer 506 that supports the inter-level dielectric layer 402 and the electrodes 501*a* and 501*b*.

Figure 6D:
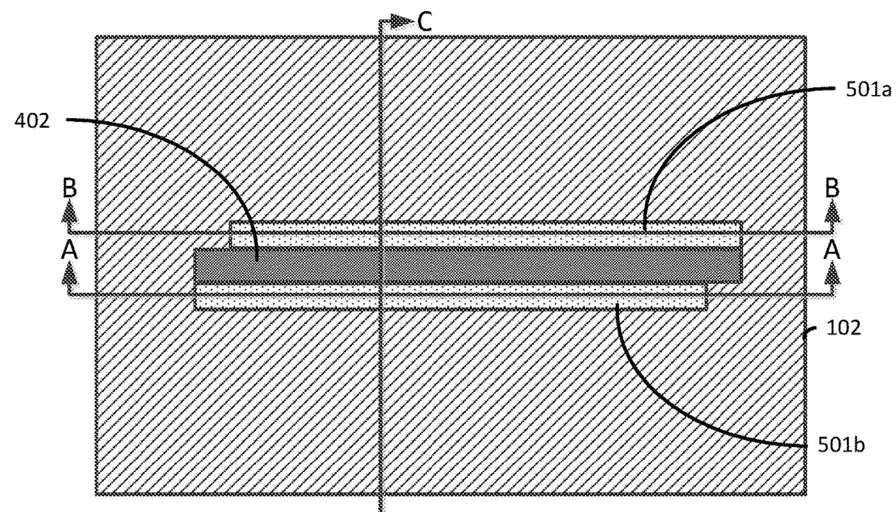
FIG. 6D illustrates a top view following the removal of the shallow trench isolation region (of FIG. 5) and the removal of portions of the doped buffer layer (of FIG. 5).

FIG. 6D illustrates a top view following the removal of the inter-level dielectric region 402 (of FIG. 5) and the removal of portions of the doped buffer layer 506 (of FIG. 5).

Figure 7:
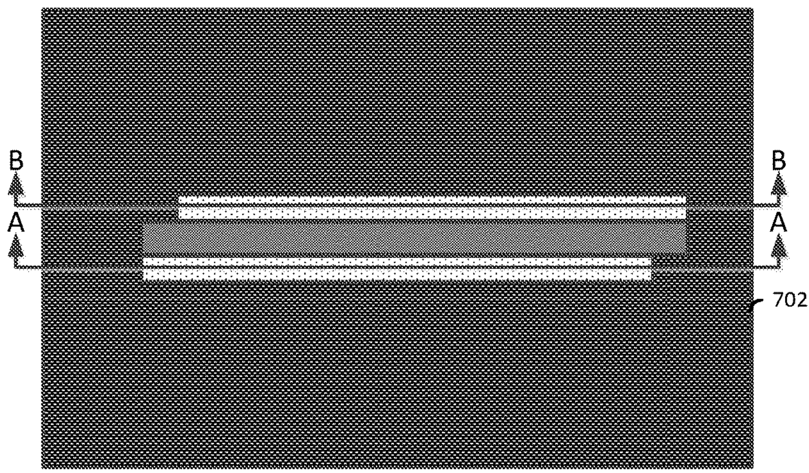

FIG. 7 illustrates a top view following the deposition of another inter-level dielectric layer 702 over exposed portions of the substrate 102 (of FIG. 5).

The inter-level dielectric layer 702 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 702 is deposited by a deposition process, including, but not limited to CVD, PVD, plasma enhanced CVD, atomic layer deposition (ALD), evaporation, chemical solution deposition, or like processes. Following the deposition of the inter-level dielectric layer 702, a planarization process such as, for example, chemical mechanical polishing is performed.

Figure 8A:
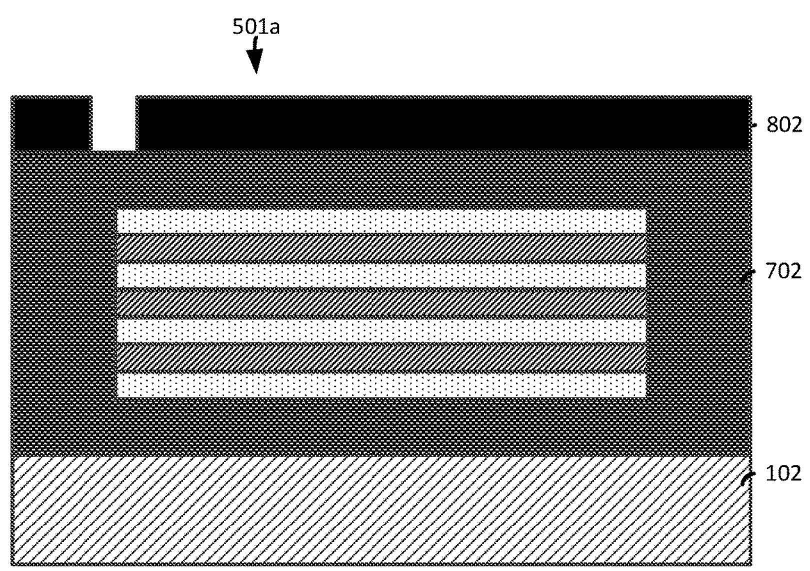
FIG. 8A illustrates a cut-away view along the line A-A (of FIG. 8C) following the patterning of a mask over portions of the inter-level dielectric layer.
Figure 8B:
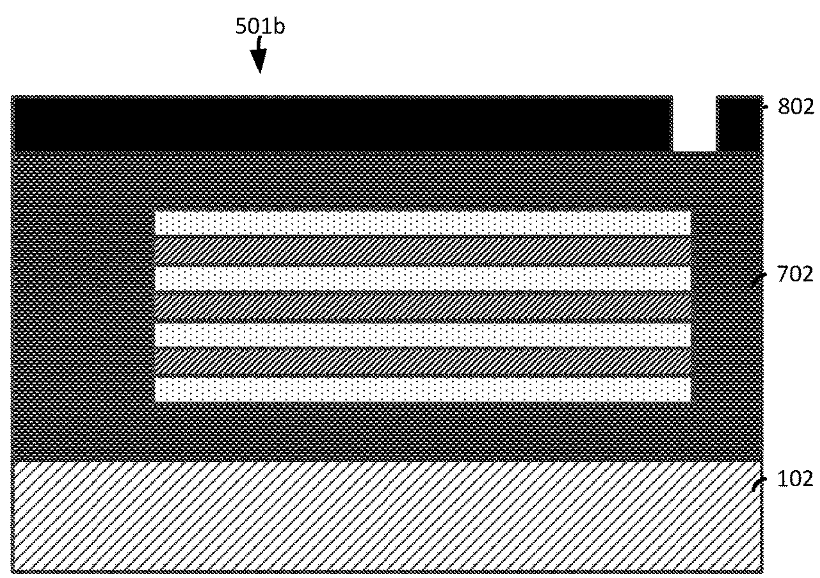
FIG. 8B illustrates a cut-away view along the line B-B (of FIG. 8C) of the mask.
Figure 8C:
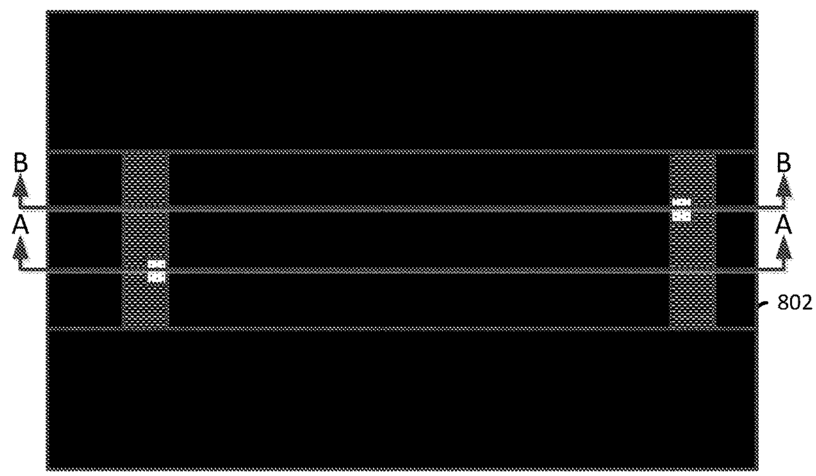
FIG. 8C illustrates a top view of the mask.

FIG. 8A illustrates a cut-away view along the line A-A (of FIG. 8C) following the patterning of a mask 802 over portions of the inter-level dielectric layer 702. The mask 802 can include, for example, an organic planarizing layer, or a photolithographic resist material. FIG. 8B illustrates a cut-away view along the line B-B (of FIG. 8C) of the mask 802. FIG. 8C illustrates a top view of the mask 802.

Figure 9A:
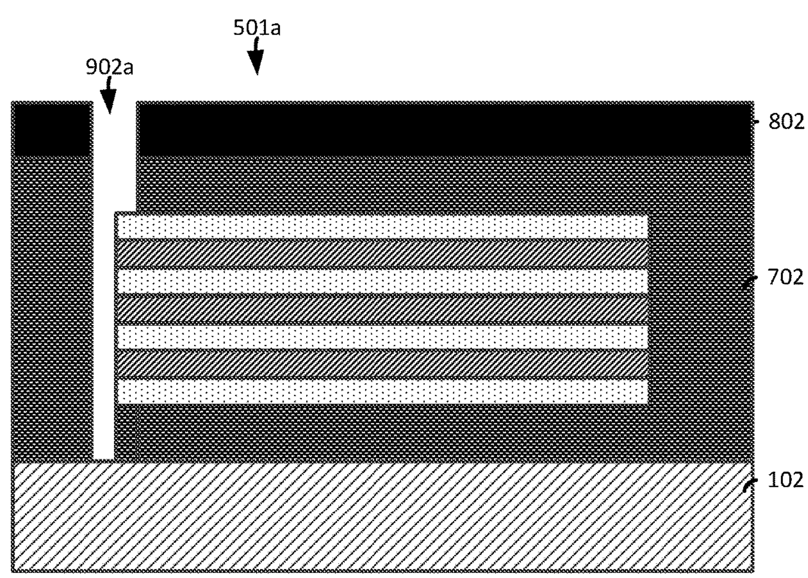
FIG. 9A illustrates a cut-away view along the line A-A (of FIG. 9C) following a selective etching process that removes exposed portions of the inter-level dielectric layer to form a cavity that exposes portions of the electrode.

FIG. 9A illustrates a cut-away view along the line A-A (of FIG. 9C) following a selective etching process that removes exposed portions of the inter-level dielectric layer 702 to form a cavity 902*a* that exposes portions of the electrode 501*a*.

Figure 9B:
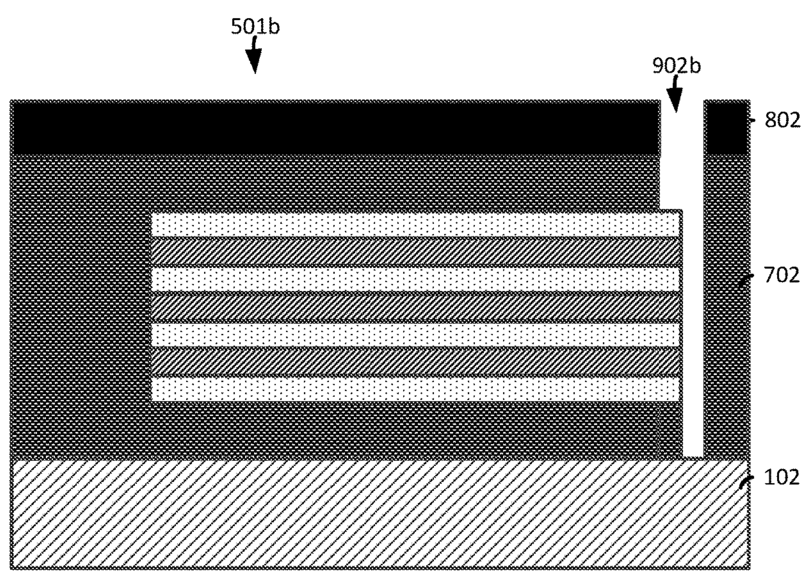
FIG. 9B illustrates a cut-away view along the line B-B (of FIG. 9C) following the selective etching process that forms the cavity that exposes portions of the electrode.
Figure 9C:
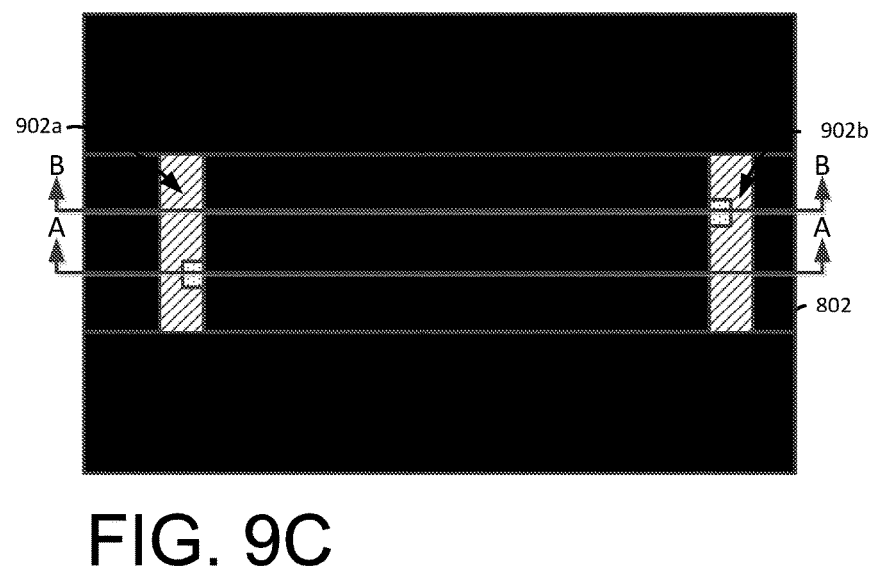

FIG. 9B illustrates a cut-away view along the line B-B (of FIG. 9C) following the selective etching process that forms the cavity 902*b* that exposes portions of the electrode 501*b*. FIG. 9C illustrates a top view following the formation of the cavities 902*a* and 902*b*.

Figure 10A:
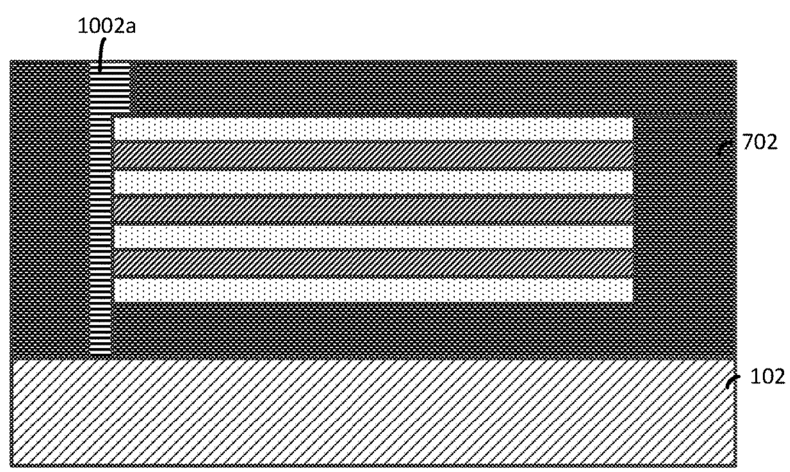
FIG. 10A illustrates a cut-away view along the line A-A (of FIG. 10C) following the removal of the mask (of FIG. 9A) and the formation of contacts in the cavity (of FIG. 9A).

FIG. 10A illustrates a cut-away view along the line A-A (of FIG. 10C) following the removal of the mask 802 (of FIG. 9A) and the formation of contacts 1002*a* in the cavity 902*a* (of FIG. 9A). The mask 802 can be removed by a suitable process such as, for example, ashing. Following the removal of the mask 802, a conductive material can be deposited in the cavities 902*a* and 902*b* (of FIG. 9B). A planarization process can be performed to remove overburdened conductive contact material. In some exemplary embodiments, a liner layer (not shown) can be deposited in the cavities 902*a* and 902*b* prior to depositing the conductive material.

The ashing process can be used to remove a photoresist material, amorphous carbon, or organic planarization (OPL) layer. Ashing is performed using a suitable reaction gas, for example, $O_2$, $N_2$, H2/N2, $O_3$, $CF_4$, or any combination thereof The conductive material can include any suitable conductive material including, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition.

Figure 10B:
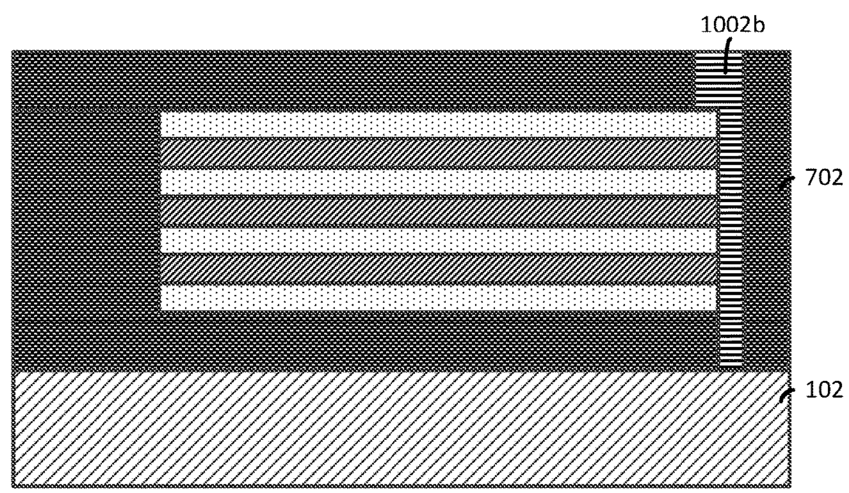
FIG. 10B illustrates a cut-away view along the line B-B (of FIG. 10C) following the formation of the conductive contact as described above.

FIG. 10B illustrates a cut-away view along the line B-B (of FIG. 10C) following the formation of the conductive contact 1002*b* as described above.

Figure 10C:
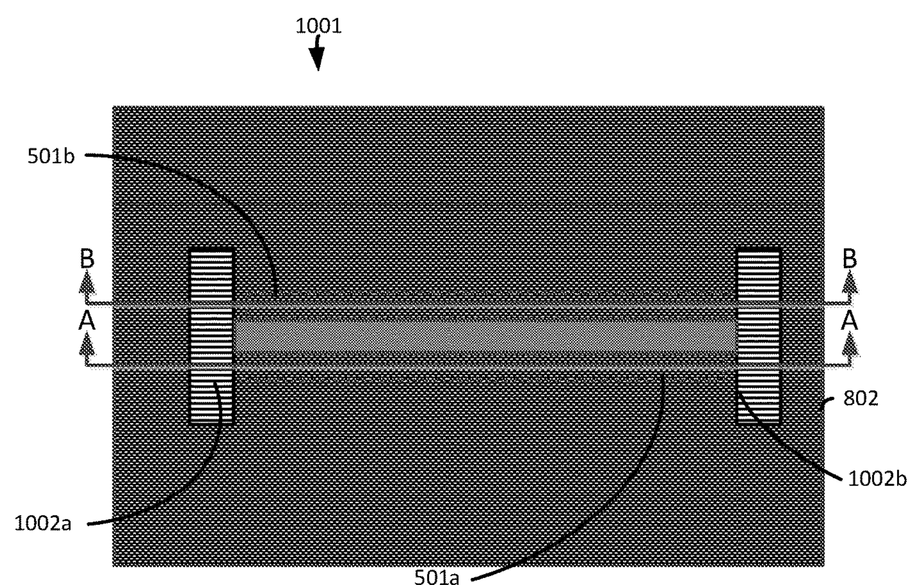

FIG. 10C illustrates a top view of the conductive contacts 1002*a* and 1002*b* and the electrodes 501*a* and 501*b* that form a capacitive device 1001.

Figure 11:
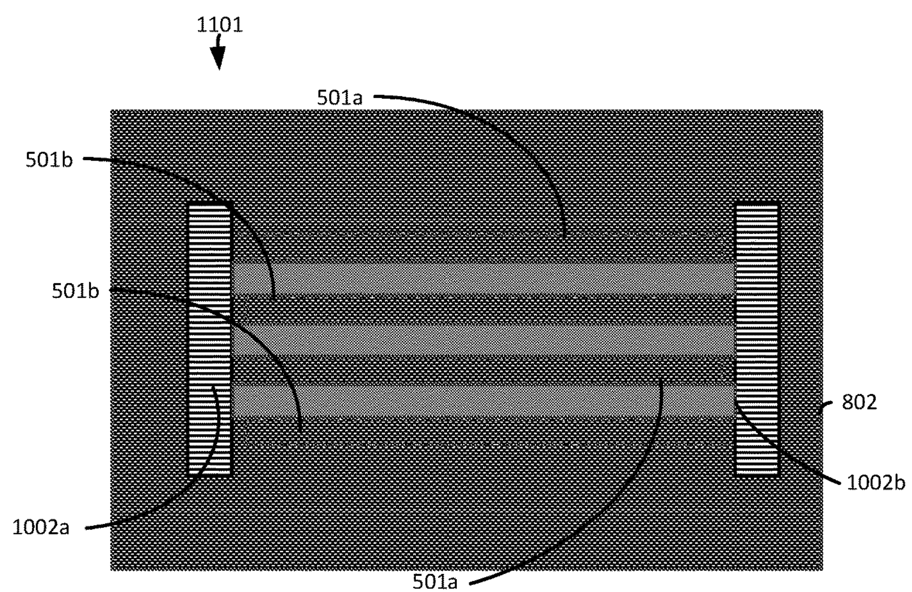
FIG. 11 illustrates a top view of an alternate exemplary embodiment of a capacitive device.

FIG. 11 illustrates a top view of an alternate exemplary embodiment of a capacitive device 1101. The capacitive device 1101 is similar to the capacitive device 1001 described above. The capacitive device 1101 includes a plurality of electrodes 501*a* and 501*b*.

Figure 12A:
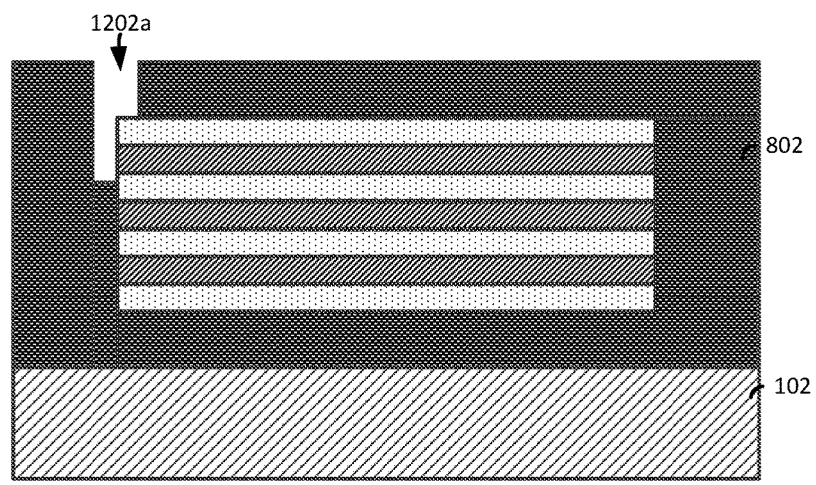
FIGS. 12A-12C illustrate an alternate exemplary method for forming a capacitive device. In this regard, the capacitive device is formed using a similar fabrication process as described above in FIGS. 1-8C.
Figure 12B:
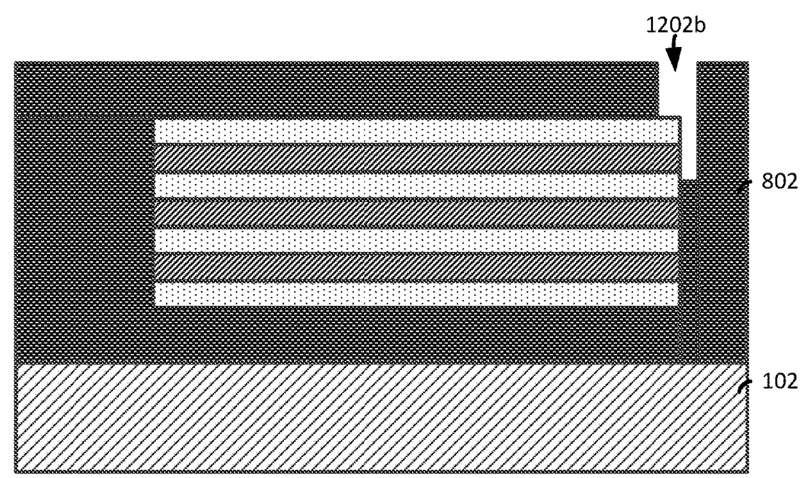
Figure 12C:
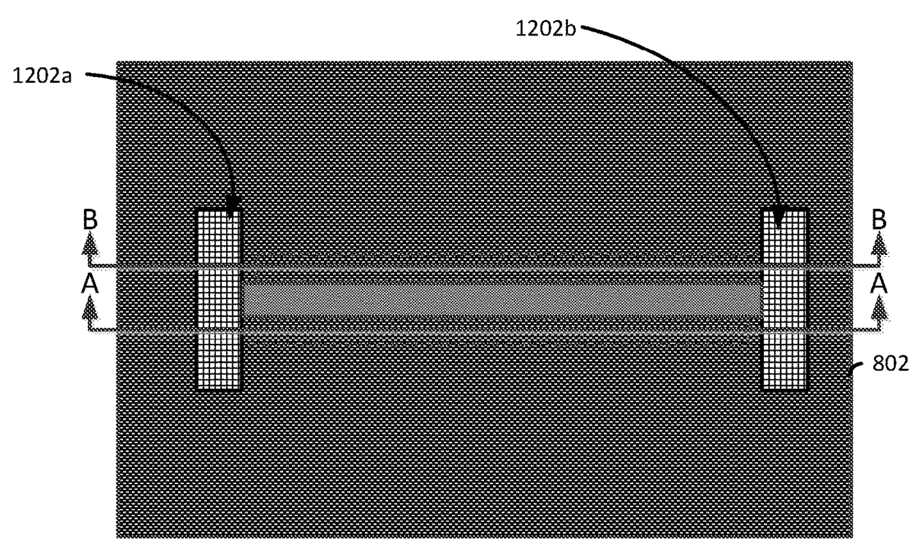

FIGS. 12A-12C illustrate an alternate exemplary method for forming a capacitive device. In this regard, the capacitive device 1201 is formed using a similar fabrication process as described above in FIGS. 1-8C.

FIG. 12A illustrates a cut-away view along the line A-A (of FIG. 12C) following the formation of a cavity 1202*a* that exposes portions of the electrode 501*a*. The cavity 1202*a* is formed by, for example, a suitable photolithographic etching process such as, for example, reactive ion etching. FIG. 12B illustrates a cut-away view along the line B-B (of FIG. 12C) following the formation of a cavity 1202*b*. FIG. 12C illustrates a top view following the formation of the cavities 1202*a* and 1202*b*.

Figure 13A:
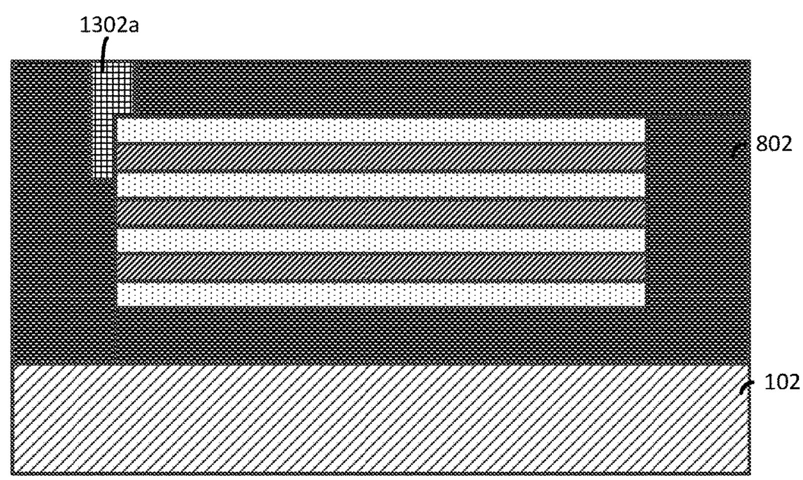
FIG. 13A illustrates a cut-away view along the line A-A (of FIG. 13C) following the formation of a conductive contact.
Figure 13B:
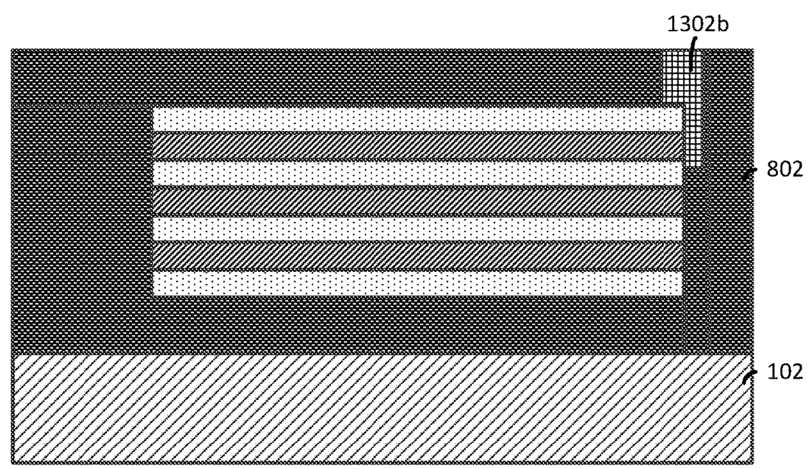
FIG. 13B illustrates a cut-away view along the line B-B (of FIG. 13C) of the conductive contact.
Figure 13C:
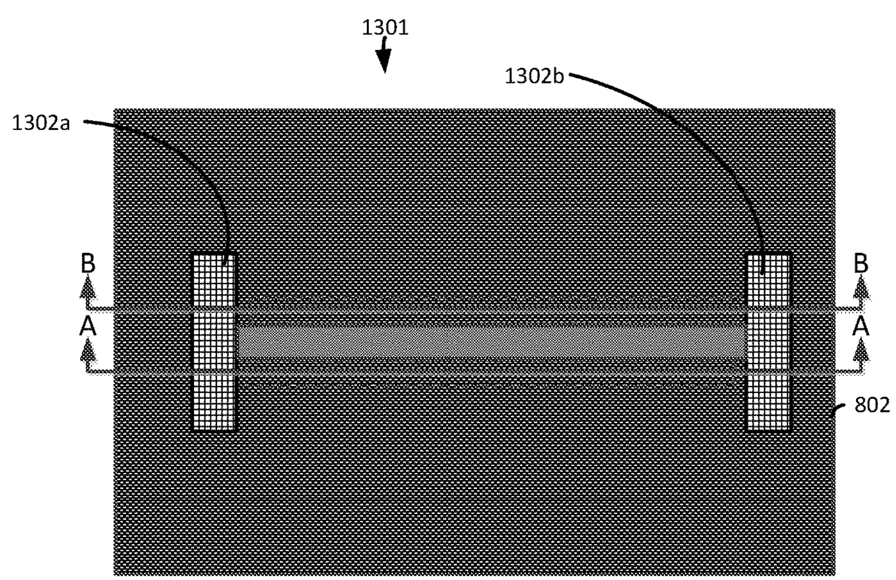
FIG. 13C illustrates a top view of the capacitive device.

FIG. 13A illustrates a cut-away view along the line A-A (of FIG. 13C) following the formation of a conductive contact 1302*a*. The conductive contact 1302*a* is formed by an epitaxial growth process that forms a doped crystalline semiconductor material such as, for example, silicon in the cavity 1202*a* (of FIG. 12A). FIG. 13B illustrates a cut-away view along the line B-B (of FIG. 13C) of the conductive contact 1302*b*. FIG. 13C illustrates a top view of the capacitive device 1301.

The methods and resultant structures described herein provide for forming capacitive devices having electrodes formed from nanowire sheets. Any number of electrodes having a variety of lengths can be formed to form capacitive devices that have desired performance parameters.

The methods described herein provide for forming capacitive devices in a process flow that can be integrated into process flows used to form active semiconductor devices.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a capacitive device, the method comprising:
- forming a buffer layer on a substrate, wherein the buffer layer includes a semiconductor material;
- forming a nanosheet stack on the buffer layer;
- removing portions of the nanosheet stack and the buffer layer to form a first fin and a second fin;
- depositing a first insulator layer on the substrate;
- implanting ions in the first fin and the second fin and annealing to form a first electrode and a second electrode;
- removing the first insulator layer;
- removing portions of the buffer layer in the first electrode and the second electrode to form a void between the first electrode and the substrate and a void between the second electrode and the substrate;
- depositing a second insulator layer on the substrate and in the void under the first electrode and the void under the second electrode; and
- forming a first conductive contact on a basal end of the first electrode and a second conductive contact on a basal end of the second electrode, the first conductive contact being formed by:
  - removing portions of the second insulator layer to form a cavity that exposes portions of the first electrode; and
  - depositing a conductive material in the cavity.

2. The method of claim 1, wherein the buffer layer includes a semiconductor dissimilar from the substrate.

3. The method of claim 1, wherein the first conductive contact includes a metallic material.

4. The method of claim 1, wherein the first electrode is arranged substantially in parallel with the second electrode.

5. The method of claim 1, wherein the nanosheet stack includes alternating layers of a first semiconductor material and a second semiconductor material.

6. The method of claim 5, wherein the first semiconductor material includes silicon germanium.

7. The method of claim 5, wherein the second semiconductor material includes silicon.

8. A method for forming a capacitive device, the method comprising:
- forming a buffer layer on a substrate, wherein the buffer layer includes a semiconductor material;
- forming a nanosheet stack on the buffer layer;
- removing portions of the nanosheet stack and the buffer layer to form a first fin and a second fin;
- depositing a first insulator layer on the substrate;
- implanting ions in the first fin and the second fin and annealing to form a first electrode and a second electrode;
- removing the first insulator layer;
- removing portions of the buffer layer in the first electrode and the second electrode to form a void between the first electrode and the substrate and a void between the second electrode and the substrate;
- depositing a second insulator layer on the substrate and in the void under the first electrode and the void under the second electrode; and
- growing a first crystalline conductive contact on a basal end of the first electrode and a second crystalline conductive contact on a basal end of the second electrode, the first crystalline conductive contact being formed by:
  - removing portions of the second insulator layer to form a cavity that exposes portions of the first electrode; and
  - growing a crystalline material in the cavity.

9. The method of claim 8, wherein the buffer layer includes a semiconductor dissimilar from the substrate.

10. The method of claim 8, wherein the first electrode is arranged substantially in parallel with the second electrode.

11. A capacitive device comprising:
- a first electrode including a first nanosheet stack, wherein the first nanosheet stack includes alternating layers of a first semiconductor material and a second semiconductor material;
- a second electrode including a second nanosheet stack, wherein the second electrode is substantially parallel to the first electrode;
- an insulator layer on a substrate and between the first electrode and the substrate and between the second electrode and the substrate;
- a first conductive contact on a basal end of the first electrode and a second conductive contact on a basal end of the second electrode, the first conductive contact being in a cavity in the insulator layer.

12. The device of claim 11, wherein the second nanosheet stack includes alternating layers of the first semiconductor material and the second semiconductor material.

13. The method of claim 12, wherein the first semiconductor material includes silicon germanium.

14. The method of claim 13, wherein the second semiconductor material includes silicon.

15. The device of claim 11, wherein the first conductive contact includes a metallic material.

16. The device of claim 11, wherein the first conductive contact includes a crystalline material.

* * * * *